United States Patent
Gustavsson et al.

(10) Patent No.: US 6,614,374 B1
(45) Date of Patent: Sep. 2, 2003

(54) HIGH PERFORMANCE SWITCHED-CAPACITOR FILTER FOR OVERSAMPLING SIGMA-DELTA DIGITAL TO ANALOG CONVERTERS

(75) Inventors: Mikael Gustavsson, Eatontown, NJ (US); Nianxiong Tan, Newport Beach, CA (US)

(73) Assignee: Globespanvirata, Inc., Red Bank, NJ (US)

( * ) Notice: Subject to any disclaimer, the term of this patent is extended or adjusted under 35 U.S.C. 154(b) by 0 days.

(21) Appl. No.: 09/855,080

(22) Filed: May 14, 2001

Related U.S. Application Data

(63) Continuation-in-part of application No. 09/517,979, filed on Mar. 3, 2000, now Pat. No. 6,268,815.
(60) Provisional application No. 60/206,067, filed on May 22, 2000, and provisional application No. 60/139,205, filed on Jun. 15, 1999.

(51) Int. Cl.[7] ................................ H03M 3/00
(52) U.S. Cl. .................. 341/143; 341/118; 341/120; 341/144
(58) Field of Search ................. 708/313, 319, 708/320; 341/61, 143, 144, 118, 120; 364/724.1, 724.16; 360/46, 65, 67, 48; 333/167

(56) References Cited

U.S. PATENT DOCUMENTS

| | | | | |
|---|---|---|---|---|
| 4,385,286 A | * | 5/1983 | Haque | 340/47 |
| 4,849,662 A | * | 7/1989 | Holberg et al. | 307/520 |
| 4,872,129 A | * | 10/1989 | Pfeifer et al. | 364/724.1 |
| 5,513,209 A | * | 4/1996 | Holm | 375/354 |
| 5,982,229 A | | 11/1999 | Wong et al. | 327/554 |
| 5,982,317 A | | 11/1999 | Steensgaard-Madsen | 341/143 |
| 5,990,819 A | | 11/1999 | Fujimori | 341/150 |
| 6,035,320 A | | 3/2000 | Kiriaki et al. | 708/819 |
| 6,040,793 A | | 3/2000 | Ferguson, Jr. et al. | 341/143 |
| 6,057,793 A | * | 5/2000 | Gong et al. | 341/143 |
| 6,081,218 A | * | 6/2000 | Ju et al. | 341/143 |
| 6,087,969 A | | 7/2000 | Stockstad et al. | 341/143 |
| 6,087,970 A | | 7/2000 | Panicacci | 341/172 |
| 6,233,594 B1 | * | 5/2001 | Tan et al. | 708/313 |
| 6,249,237 B1 | * | 6/2001 | Prater | 341/126 |
| 6,337,636 B1 | * | 1/2002 | Page et al. | 340/870.13 |

* cited by examiner

Primary Examiner—Michael Tokar
Assistant Examiner—Linh Van Nguyen
(74) Attorney, Agent, or Firm—Thomas, Kayden, Horstemeyer & Risley

(57) ABSTRACT

A SINC filter for an oversampling Sigma-Delta digital to analog converter (OSDAC) having a cascaded construction that results in reduced sensitivity to capacitor mismatch. Specifically, the SINC filter circuit filter may be defined by a transfer function H(z), which is further defined by first constituent transfer functions $H_1(z)$ and $H_2(z)$. The constituent transfer functions may be implemented in a cascaded fashion. Preferably, one of the cascaded sections includes a resistor string that defines a plurality of reference voltages. A plurality of switching elements are configured to controllably switch these reference voltages to a capacitor of a tap.

19 Claims, 11 Drawing Sheets

HIGH PERFORMANCE SWITCHED-CAPACITOR FILTER FOR OVERSAMPLING SIGMA-DELTA DIGITAL TO ANALOG CONVERTERS

CROSS-REFERENCE TO RELATED APPLICATION

The present application is a continuation-in-part application of U.S. patent application Ser. No. 09/517,979 filed Mar. 03, 2000. U.S. Pat. No. 6,268,815; entitled High Performance Switched-Capacitor Filter for Oversampling Sigma-Delta Digital to Analog Converters, which claims benefit of provisional patent Serial No. 60/139,205 filed Jun. 15, 1999; which is hereby incorporated by reference. The present application also claims the benefit of U.S. provisional patent application, serial No. 60/206,067, filed May 22, 2000, which is hereby incorporated by reference in its entirety.

BACKGROUND OF THE INVENTION

1. Field of the Invention

The present invention generally relates to high speed data communications wherein signal information is processed both in digital and analog forms. More specifically, the invention relates to a digital to analog data converter integrated circuit, which solves problems associated with integration density, power consumption, and data transmission protocol compatibility for central office digital subscriber line circuit cards.

2. Discussion of the Related Art

With the advancement of technology, and the need for instantaneous information, the ability to transfer digital information from one location to another, such as from a central office to customer premises, has become more and more important.

In a digital subscriber line (DSL) system, data is transmitted from a central office to customer premises via a transmission line, such as a two-wire pair, and is transmitted from the customer premise to the central office as well, either simultaneously or in different communication sessions. The same transmission line might be utilized for data transfer by both sites or the transmission to and from the central office might occur on two separate lines. In its most general configuration, a DSL card at a central office is comprised of a digital signal processor (DSP) which receives information from a data source and sends information to an analog front-end (AFE). The AFE serves as the interface between an analog line, such as the two-wire pair, and the DSP. The AFE functions to convert digital data, from the DSP, into a continuous time analog signal when processing downstream data. Conversely, the AFE serves to convert an analog signal to digital data when processing upstream data.

As an important part of the aforementioned system responsible for proper transmission and reception of data in a broadband network, the AFE performs multiple functions in addition to converting a digital signal into a continuous time analog signal. However, the functionality of the AFE is particular to the specific DSL application considered, wherein factors such as signal bandwidth, data rate, data reach, signal quality, power budget, and different applicable standards determine the optimum AFE. In order to minimize application-specific implementations of digital-to-analog converters (DACs) across the many DSL applications, it is desired to create a high-performance configurable DAC.

Considering the many flavors of DSL applications, the adaptability problem becomes more apparent. Focusing on ADSL applications, there are a number of different implementation standards available including: DMT-FDM, DMT-EC, G.lite, CAP-RADSL, and ADSL over ISDN, hereinafter the aforementioned ADSL applications will be denoted xDSL. For each application, the optimum AFE configuration varies. Subsequently, the DAC implementation for each separate AFE configuration must vary appropriately.

Sigma-Delta modulation is a method used to perform both analog-to-digital and digital-to-analog conversions. It uses the concept of over-sampling and digital signal processing in order to achieve high resolution of the desired signal bandwidth. Various Sigma-Delta architectures exist with many used in instrumentation, speech, high-fidelity audio digitization, digital cellular radio, and integrated services digital network (ISDN) applications. Sigma-Delta modulation may also be employed to perform analog-to-digital (ADC) and DACs for higher frequency signals in a variety of communications systems, such as xDSL applications.

A Sigma-Delta based DAC is a common choice when both high resolution and low distortion are desired. The high resolution and low distortion requirements in xDSL applications make the Sigma-Delta architecture a natural starting point for high performance DAC designs. However, the Sigma-Delta methodology presents some problems when adapted to xDSL applications.

Most of the published Sigma-Delta DACs are used in audio applications where the signal bandwidth of interest is approximately 20 kHz. In audio applications, a high over-sampling ratio can be easily achieved. In xDSL applications, the signal bandwidth of interest increases from 20 kHz to approximately 1 MHz. Conversion of the Sigma-Delta DAC from an audio application to a xDSL application requires an increase in the sampling rate that makes designing for low power consumption and low signal distortion difficult. Decimating the input signal to the switched-capacitor (SC) filter reduces the speed requirements, but requires an additional finite impulse response (FIR) filter and an operational-amplifier (op-amp). As a result, prior art DACs in xDSL applications have not achieved the signal bandwidth requirements of multiple xDSL applications in a power-efficient manner.

SUMMARY OF THE INVENTION

Certain objects, advantages and novel features of the invention will be set forth in part in the description that follows and in part will become apparent to those skilled in the art upon examination of the following or may be learned with the practice of the invention. One significant advantage of the present invention is the ability to effectively reduce crosstalk without any knowledge of (or without making any assumptions about) the crosstalk or the disturber signal. This significantly differs from certain prior art systems, which either have knowledge of or make certain assumptions about the disturber signal. The objects and advantages of the invention may be realized and obtained by means of the instrumentalities and combinations particularly pointed out in the appended claims.

To achieve the advantages and novel features, the present invention is generally directed to a SINC filter for an oversampling Sigma-Delta digital to analog converter (OSDAC) having a cascaded construction that results in reduced sensitivity to capacitor mismatch. Specifically, the SINC filter circuit filter may be defined by a transfer function $H(z)$, which is further defined by first constituent transfer functions $H_1(z)$ and $H_2(z)$. The constituent transfer functions may be implemented in a cascaded fashion.

Preferably, one of the cascaded sections includes a resistor string that defines a plurality of reference voltages. A plurality of switching elements are configured to controllably switch these reference voltages to a capacitor of a tap.

BRIEF DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE INVENTION

Figure 1:
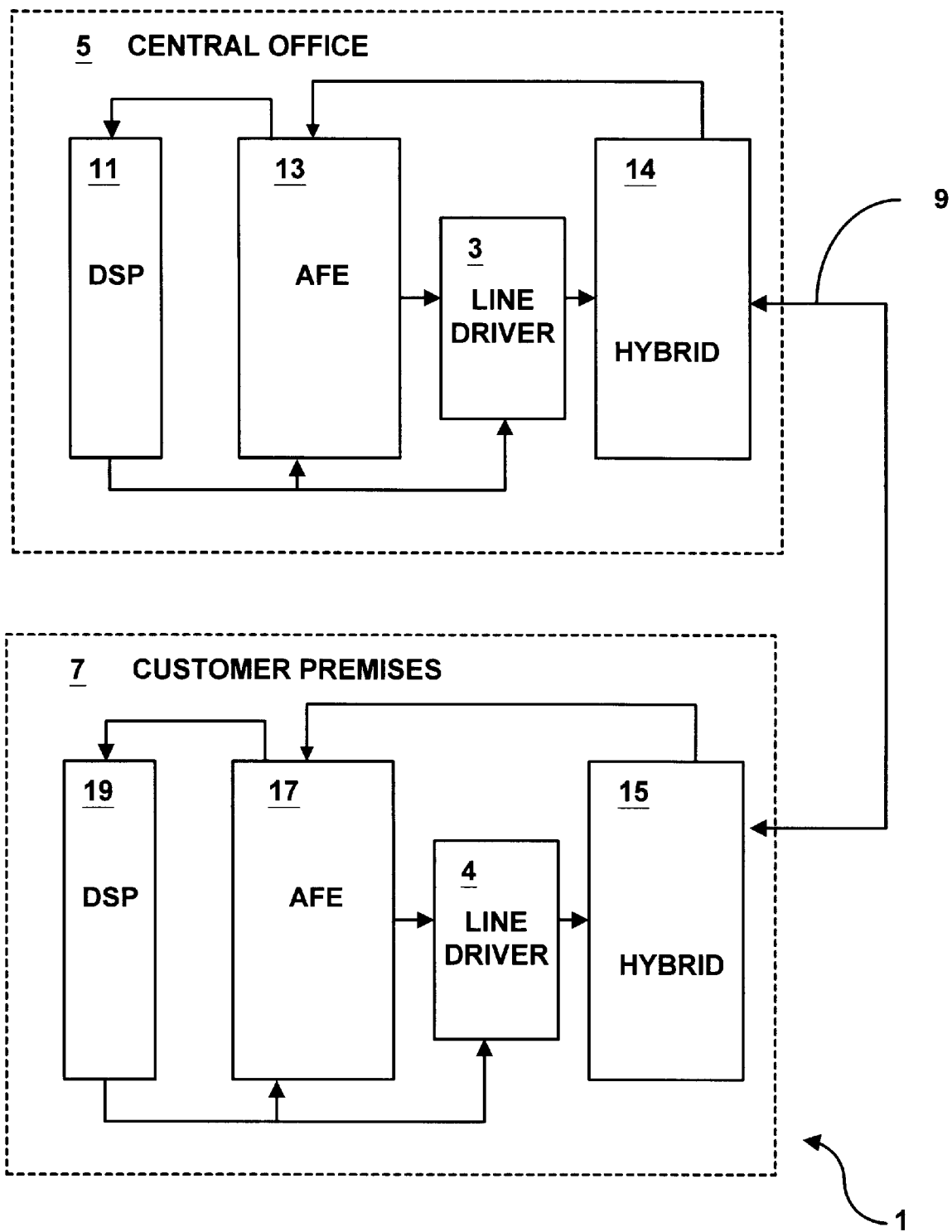
FIG. 1 is a prior art top-level representation of a typical digital subscriber line system utilizing a digital signal processor, an analog front-end, a line driver, and a hybrid.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims. Turning now to the drawings, wherein like referenced numerals designate corresponding parts throughout the drawings, FIG. 1 shows a prior art top level representation of a typical xDSL system 1 utilizing an AFE which is separate from a line driver and a hybrid. The xDSL system 1 illustrates transmission of data from a central office 5 to a customer premises 7 via a transmission line 9, such as, but not limited to, a two-wire pair, and transmission of data from the customer premises 7 to the central office 5. With regard to the present illustration, transmission of data may be directed from the customer premises 7 to the central office 5, from the central office 5 to the customer premises 7, or in both directions simultaneously. Further, transmission of data can either flow on the same line in both directions, or on separate lines, one in each direction.

The central office 5 includes a line card that includes a DSP 11, which receives and sends information through AFE 13. AFE 13 serves as the interface between DSP 11 where all signals are represented in their digital form and the remainder of the xDSL equipment where signals are analog in nature. AFE 13 converts digital signals from DSP 11 into a continuous analog signal for downstream data transmission via the two-wire pair 9. In addition, AFE 13 converts analog signals received from central office 5 into a digital data stream for upstream data transmission to DSP 11.

The analog signal is delivered, via a line driver 3, in accordance with the amount of power required to drive the amplified analog signal through the two-wire pair 9 along to customer premises 7. The hybrid 15, located in the customer premises 7, is then used to de-couple the received signal from the transmitted signal, by subtracting the transmitted signal from the sum of the transmitted and received signals. The AFE 17, located in the customer premises 7, then converts the received analog signal into a digital signal, which is then transmitted to DSP 19 located in the customer premises 7. Finally, the digital information is transmitted to the data source specified to receive the information.

If an analog signal is delivered from the customer premises 7 to the central office 5, line driver 4 will deliver the signal in accordance with the amount of power required to drive the amplified analog signal through the two-wire pair 9 and to the central office 5. A hybrid 14, located in the central office 5, is then used to de-couple the received signal from the transmitted signal, by subtracting the transmitted signal from the sum of the transmitted and received signal. AFE 13, located in the central office 5, then converts the received analog signal into a digital signal, which is then transmitted to DSP 11 located in the central office 5. Finally, the digital information is transmitted to the destination unit specified to receive the information.

Figure 2:
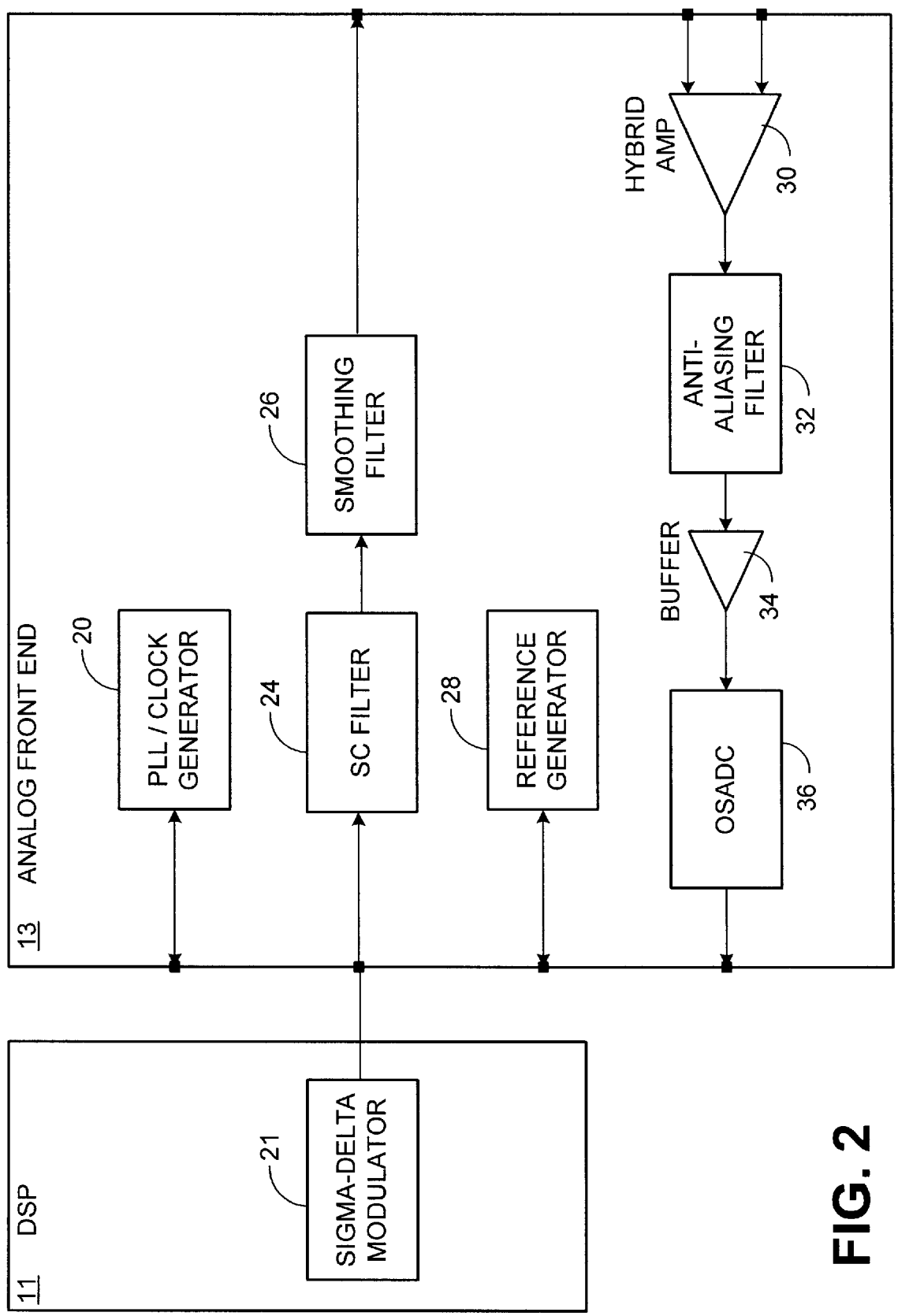
FIG. 2 is a block diagram that depicts a general analog front-end circuit based on OSADC and OSDAC used in xDSL applications.

Referring now to FIG. 2, an AFE 13 in accordance with the preferred embodiment of the invention is illustrated. Hybrid amp 30 receives both the upstream signal from the customer premises and the transmitted downstream signal from the central office. Hybrid amp 30 and external components (not shown) are configured to de-couple the received signal from the transmitted signal, by subtracting the transmitted signal from the sum of the transmitted and received signals.

Anti-Aliasing filter (AAF) 32 and buffer 34 are configured to provide a low-pass filter with an adjustable cut-off frequency tailored to the particular xDSL application desired. The cut-off frequency is determined by the combination of a resistor and capacitor in a manner well known by those skilled in the art. Buffer 34 is required to drive the switched-capacitor load at the over-sampling analog to digital converter (OSADC) input.

The OSADC 36 samples the received signal at a rate much higher than the Nyquist sampling rate. OSADC 36 provides a high-resolution, low-distortion digital representation of the received upstream information signal to the xDSL DSP 11.

Reference generator 28 and phase locked-loop (PLL)/clock generator 20 provide the necessary baseline signals that coordinate and direct operation of the AFE functional blocks responsible for analog-to-digital signal conversion and conversely, the digital-to-analog data conversion. PLL/clock generator 20 generates a clock used in the SC filter 24 by dividing the frequency of the input signal by a predetermined decimating factor. In addition, PLL/clock generator 20 creates the clock phases needed in the SC filter 24. The implementation and application of reference generator 28 and PLL/clock generator 20 throughout AFE 13 is understood by those skilled in the art and need not be described in detail herein.

Having briefly described the analog-to-digital conversion process in AFE 13 at a functional block level, reference is now made to the digital-to-analog signal conversion process therein. In this regard, the digital Sigma-Delta modulator 21 in DSP 11 converts a high-resolution digital signal into an oversampled 1-bit signal. This 1-bit data stream contains high-frequency quantization noise, which must be removed by a low-pass filter. The SC filter 24 receives the serial stream of digital data from the digital Sigma-Delta modulator in DSP 11. To remove images caused by the sample and hold function of the SC filter 24, the signal from SC filter 24 is further low-pass filtered by the continuous-time smoothing filter 26.

In order to accurately transform the digital pulse train into a continuous time analog signal without adding undesirable levels of noise and distortion, SC filter 24 first decimates the sample rate used in the digital Sigma-Delta modulator by a predetermined factor. Next, SC filter 24 removes part of the quantization noise generated in the Sigma-Delta modulator at the lower decimated sampling rate. Finally, SC filter 24 uses a sample and hold buffer to further process the analog information signal before sending the signal to smoothing filter 26.

The output of the smoothing filter 26 can either go directly to the line driver 3 (see FIG. 1), as is the case when both the transmission and reception of information is performed in the same bandwidth, or to an external transmit filter (not shown), as is the case when transmission and reception of data is performed in different bandwidths.

If the analog signal is transmitted to an external transmit filter, the external transmit filter removes out-of-band noise and distortion from the transmit-frequency band which falls into the receive-frequency band. By way of example, if the frequency band allocated for transmission of the analog signal encompasses the range of 201 to 400 kHz and the frequency band allocated for reception of the analog signal encompasses the range of 50 to 200 kHz, the filter, driven by a transmit buffer, filters the transmit-signal in the frequency range from 50 to 200 kHz.

Figure 3:
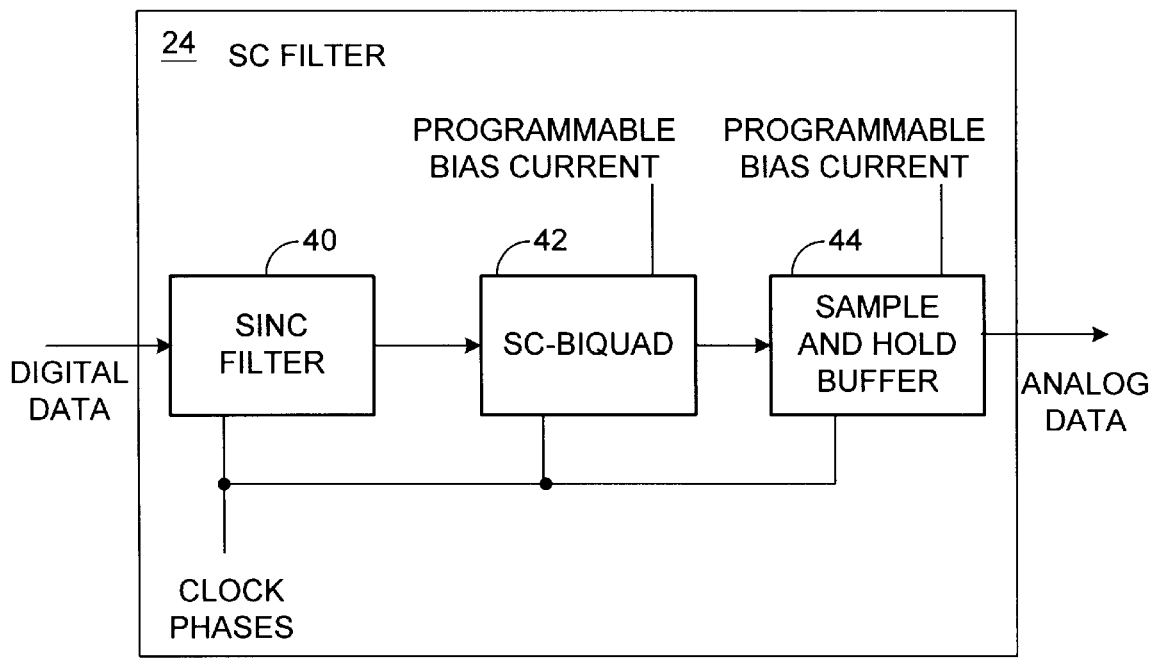
FIG. 3 is a block diagram that illustrates the functional elements of the SC filter of the present invention.

Having described operation of the analog front end illustrated in FIG. 2, reference is now directed to FIG. 3. In this regard, FIG. 3 is a block diagram that illustrates the three functional stages of SC filter 24. When a data signal is transmitted from DSP 11 to the AFE 13 (see FIG. 1), the DSP 11 encodes the data with a Sigma-Delta modulator to enable generation of high-resolution waveforms in the AFE 13. During encoding there is the dilemma of trading off signal bandwidth versus signal resolution by selecting an appropriate over-sampling ratio. As an example, if the Sigma-Delta modulator samples at 64 MHz, a signal bandwidth of 1 MHz may be used with an over-sampling rate (OSR) of 32, or a signal bandwidth of 500 kHz may be used with an OSR of 64. Selecting the higher OSR would significantly improve the signal quality up to 500 kHz, while significantly degrading the signal quality from 500 kHz to 1 MHz. Thus, it is important to select the OSR in accordance with the different xDSL applications and various bandwidths confronted by the AFE 13.

Therefore, in accordance with the preferred embodiment of the invention, the SC filter 24 contains a programmability feature which tracks the OSR utilized by the DSP 11 and adopts the cut-off frequency of the SC filter 24 accordingly.

In order to take full advantage if this feature, the cut-off frequency of the SC filter 24 tracks the inverse of the OSR according to the following equation:

$$BW = \frac{F_S}{2 \cdot OSR},$$

where, $F_S$ is the sampling frequency of the digital Sigma-Delta modulator, OSR is the over-sampling ratio of the modulator, and BW is the bandwidth allocated for the data signal, or cut-off frequency of the SC filter 24. The bandwidth of the SC filter 24 may be changed by adjusting the sampling frequency of the SC filter 24 and/or the capacitance of the capacitors used in the SC filter 24.

SINC filter 40 performs both digital-to-analog conversion and SINC filtering by using switched-capacitors. SINC filter 40 may be configured to decimate the digital data signal by a predetermined factor such that both the digital-to-analog conversion and the SINC filtering may be performed at the lower decimated rate. SC-biquad 42 receives the signal from the SINC filter and removes some of the high-frequency noise generated in the digital Sigma-Delta modulator. The sampling rate of SC-biquad 42 is the lower decimated rate. SC-biquad 42 then provides a first stage analog representation of the data signal to the sample-and-hold buffer 44. The sample-and-hold buffer 44 generates a low-distortion continuous time analog signal and drives smoothing filter 26 (see FIG. 2).

Figure 4A:
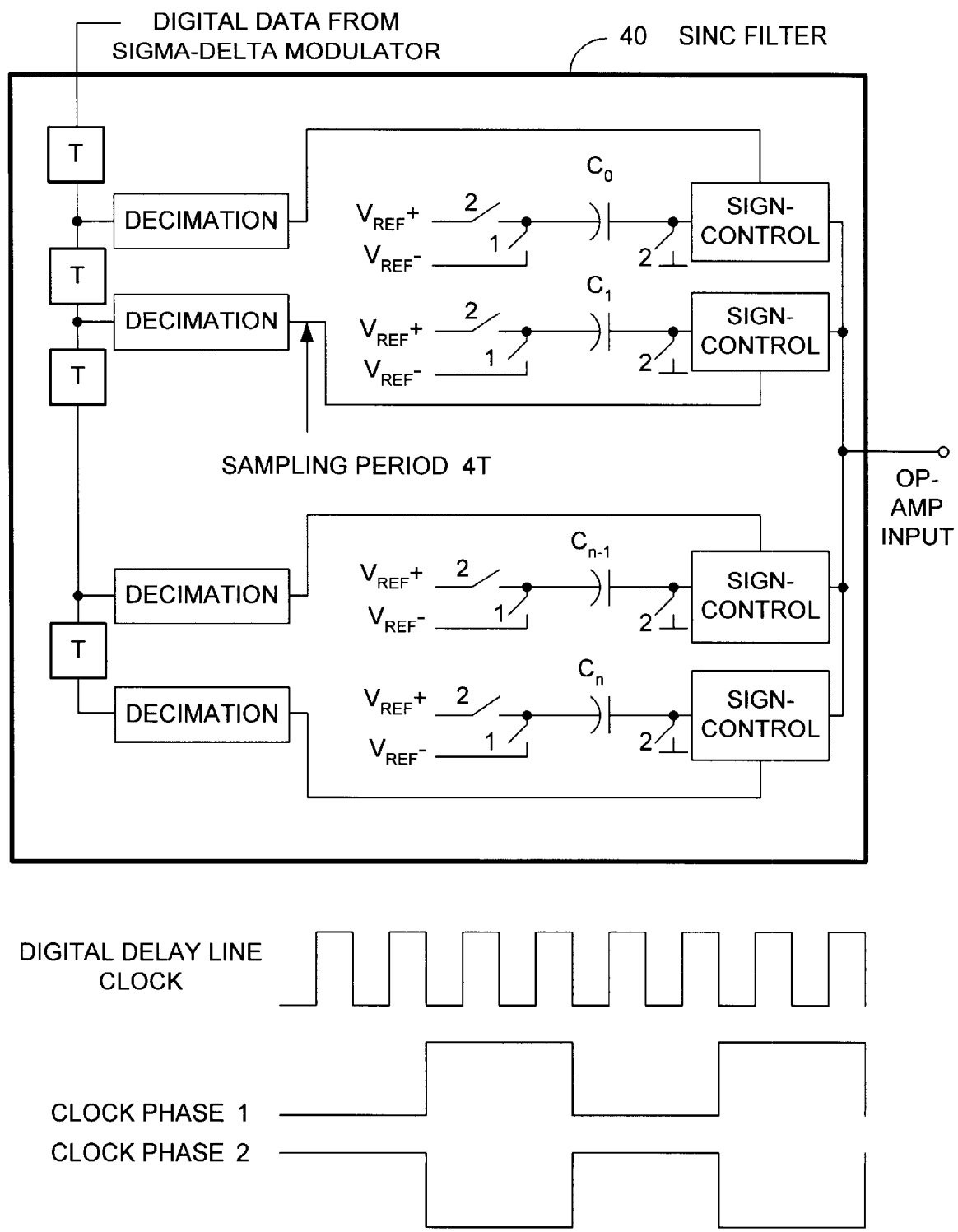
FIG. 4A is a circuit diagram of one embodiment of a SINC filter for the SC filter of FIG. 3.

Having briefly described the functional components of SC filter 24, reference is directed to FIG. 4A, which illustrates the SINC filter. The SINC filter 40 receives the digital 1-bit data from the Sigma-Delta modulator and stores the data in a digital delay line. This delay line is updated at the same rate as the modulator. The digital data is decimated by a predetermined factor. FIG. 4A illustrates a SINC filter designated to decimate the input signal by a factor of 4. By decimating the input signal by a factor of 4, the values in the delay line of the filter need only be sampled at one-fourth the rate of the digital Sigma-Delta modulator. The charges on capacitors $C_0$ through $C_n$ are sampled on clock phase 1 and summed on clock phase 2. The clock phases are non-overlapping and have a repetition period corresponding to the lower decimated rate. The sign of the signal transferred from each tap in the SINC filter to the input of the op-amp in the following SC-biquad is controlled by the decimated signal from the digital delay line. For simplicity of illustration, FIG. 4A shows only one channel, but the implementation is fully differential.

Figure 4B:
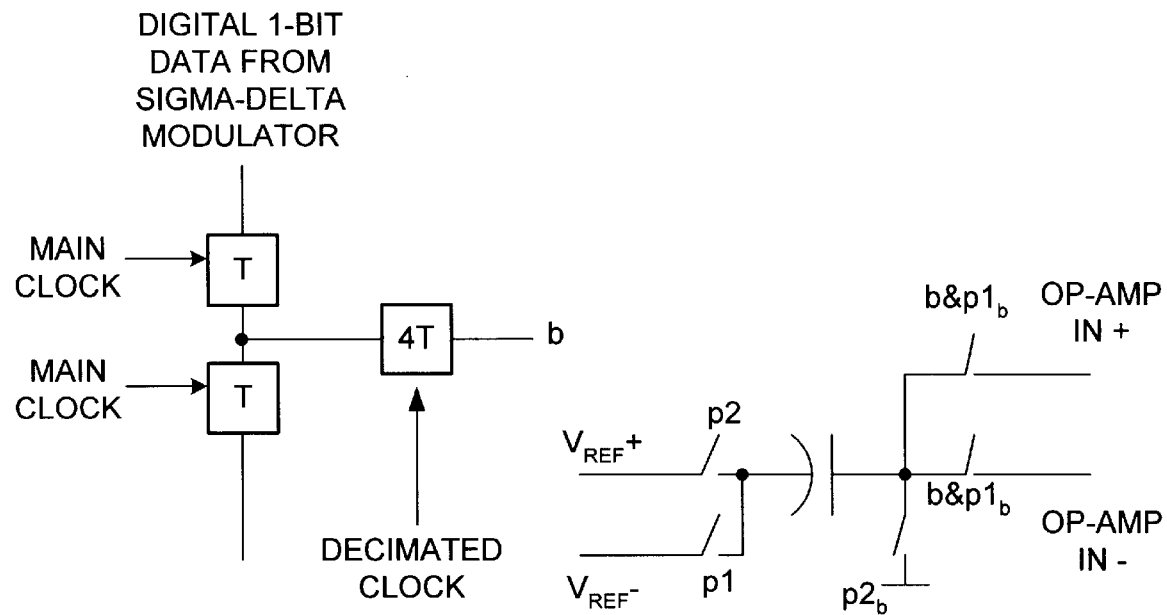
FIG. 4B is a circuit and clock timing diagram further illustrating the operation of the bottom plate switches of the SINC filter.
Figure 4B:
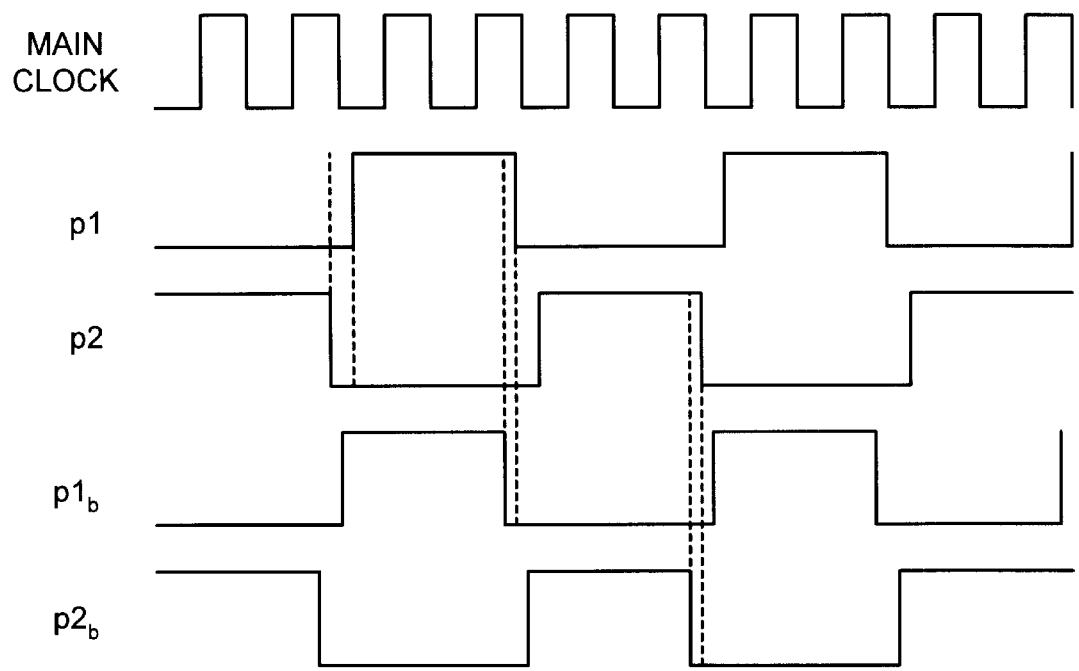

The capacitors in the SINC filter 40 are operated as illustrated in FIG. 4B. The bottom-plate switches of the SINC filter 40 are controlled by the decimated digital data from the digital delay line. P1 and p2 are non-overlapping clock phases. $P1_b$ and $p2_b$ represent clock phases that are turned off slightly before $p_1$ and $p_2$ to enable bottom-plate sampling which reduces the distortion. The top plate of each of the capacitors is switched between $V_{REF}+$ and $V_{REF}-$ to make the effective input signal larger. On clock phase p1, the bottom plate is connected to the positive or negative input of the op-amp in the following SC-biquad 42 depending on the data received from the delay line. Applying the digital data input to the bottom-plate switches makes the load on the reference buffers signal independent.

Figure 5:
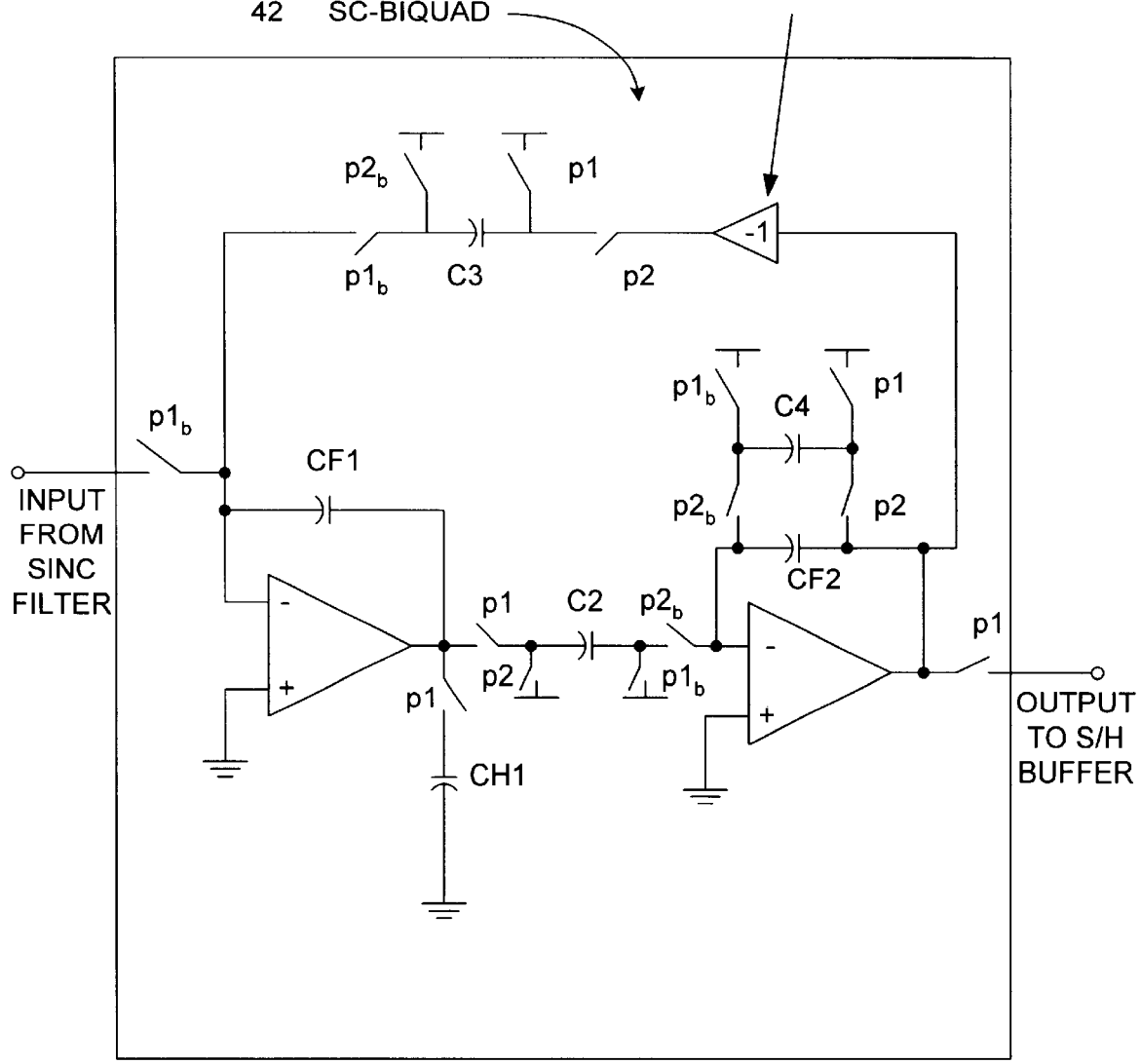
FIG. 5 is a circuit diagram of one embodiment of the SC-biquad of FIG. 3.

Having described operation of the SINC filter 40, reference is now directed to FIG. 5. FIG. 5 illustrates a circuit diagram of the SC-biquad 42. SC-biquad 42 is an example of a switched-capacitor filter that is well known by those skilled in the art. The time constant that determines the frequency response of the SC biquad 42 is determined by the clock period and the capacitance ratio. Since both of these parameters can be well controlled in the integrated circuit manufacturing process, the SC-biquad 42 is particularly suited to high performance applications. Note that the input signal from the SINC filter 40 consists of a charge from each of the switched-capacitors of the SINC filter 40 summed at the input of the SC-biquad 42 on clock phase pl. The output of SC-biquad 42 is applied to the input of the sample and hold buffer 44 on clock phase 1.

Figure 6:
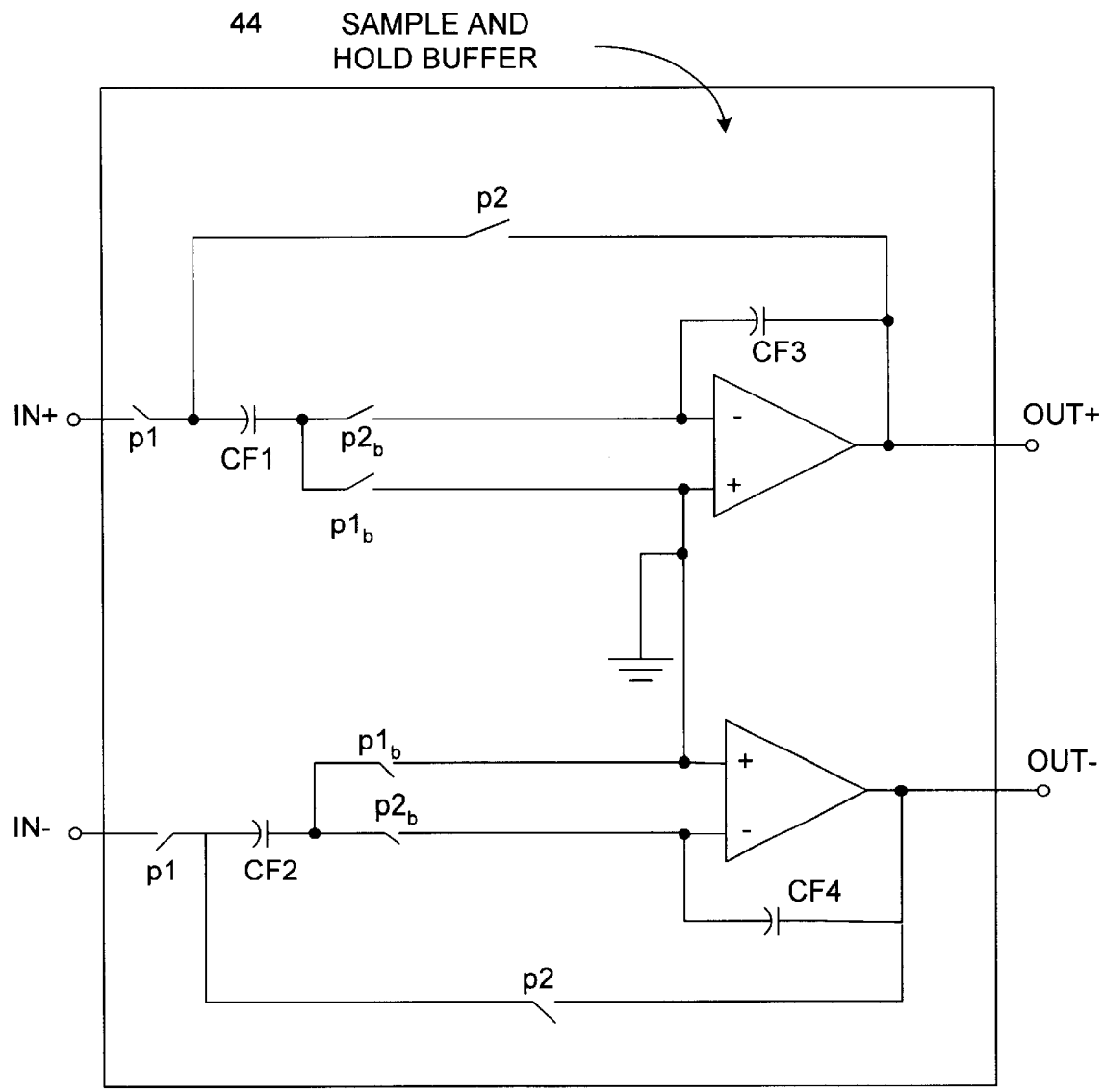
FIG. 6 is a circuit diagram of one embodiment of the sample and hold buffer of FIG. 3.

Reference is now directed to FIG. 6 which illustrates the sample and hold buffer 44 of the present invention. The sample and hold buffer 44 uses two single-ended output op-amps as shown in the circuit of FIG. 6. By implementing the switching configuration per the clock phases shown in the figure, a fast charge transfer is achieved with minimal signal distortion. The op-amp used in the sample and hold buffer 44 may be a two-stage amplifier with Miller compensation. Such a two-stage amplifier configuration could to drive the resistive load of the smoothing filter 26, without requiring another buffer stage. As a result, power is saved.

Further Inventive Improvement

While the architecture described above realizes an effective OSDAC, it has been found that the alternative configuration described below offers further improvement. Specifically, the particularly circuit configuration of the SINC filter 40 described above is sensitive to tolerance variations among the capacitors (e.g., C1, C2, ... Cn). In this regard, the capacitor values for the capacitors of SINC filter 40 are relatively small. As a result, normal tolerance variations that occur in standard CMOS fabrication processes can result in a significant increase of the noise floor at low frequency operation. Accordingly, an alternative embodiment of the invention, discussed below, has been developed, which results in much lower sensitivity to capacitor mismatch.

From the foregoing discussion, it should be appreciated that the SINC filter 40 is provided to avoid that noise may otherwise be folded to the signal band when the signal is decimated. In the application of the illustrated embodiment, a third order SINC filter is sufficient. However, other SINC filters of other orders may be utilized consistent with the scope and spirit of the invention. An example third order transfer function is given by $$H(z) = \frac{1}{64} \cdot \left(\frac{1-z^{-4}}{1-z^{-1}}\right)^3$$

$$H(z) = \frac{1 + 3 \cdot z^{-1} + 6 \cdot z^3 + 10 \cdot z^{-3} + 12 \cdot z^{-4} + 12 \cdot z^{-5} + 10 \cdot z^{-6} + 6 \cdot z^{-7} + 3 \cdot z^{-8} + z^{-9}}{64}$$

In the previously-described embodiment, the SINC filter 40 is implemented by using switched capacitors. One capacitor is used for each tap in the filter. To improve matching, the capacitors are divided into unit capacitors such that in total 64 unit capacitors are used. The total capacitance should be approximately 5 pF to keep the thermal noise reasonably small. Therefore, the unit capacitor size is as small as 80 fF. This results in reduced matching due to the small physical capacitor size. Increasing the unit size of the capacitors is not a viable option, because it would result in undesirably large power consumption.

The principle of the SINC-filter is illustrated in FIG. 4A (the exact switching used in the implementation is not shown, as it will be understood by persons skilled in the art). As illustrated, the digital data is fed to a delay line at the higher speed (e.g., 70.656 MHz). The digital data in the delay line determines the sign of the charge stored on each capacitor. The switched capacitors need only run at the decimated rate (e.g., 17.664 MHz). The total charge on all capacitors is summed and transferred by switching the left hand side of the capacitors to ground and the right hand side to the first op-amp in the biquad. Only one channel is shown in FIG. 4A but the actual implementation may be fully differential.

Figure 7:
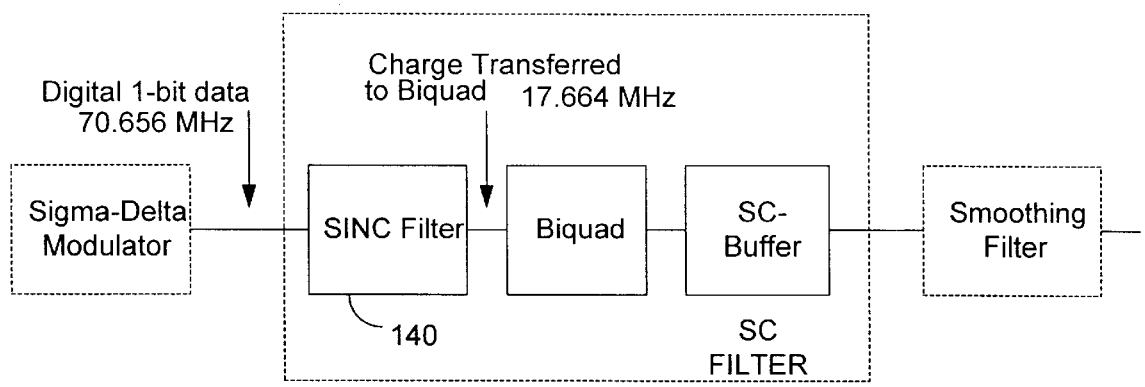
FIG. 7 is a block diagram similar to FIG. 3, but illustrating a SINC filter constructed in accordance with an alternative embodiment.

As mentioned above, implementation of the SINC filter 40, as illustrated in FIG. 4A, results in undesired sensitivity to capacitor mismatch. It is known that the sensitivity to capacitor mismatch can be reduced by implementing the SINC filter 140 (see FIG. 7) as a cascaded filter. However, previous implementations require that at least one op-amp runs at the higher sampling rate, which increases the power consumption. The invention described herein overcomes this problem. In accordance with the scope and spirit of the present invention, various levels and numbers of cascaded filters may be utilized. In the preferred embodiment, however, two cascaded filters are utilized, and their respective transfer functions are:

$$H_1(z) = \frac{1}{4} \cdot \left(\frac{1-z^{-4}}{1-z^{-1}}\right)^1 = \frac{1 + 1 \cdot z^{-1} + 1 \cdot z^{-2} + 1 \cdot z^{-3}}{4} \text{ and}$$

$$H_2(z) = \frac{1}{16} \cdot \left(\frac{1-z^{-4}}{1-z^{-1}}\right)^2 = \frac{1 + 2 \cdot z^{-1} + 3 \cdot z^{-2} + 4 \cdot z^{-3} + 3 \cdot z^{-4} + 2 \cdot z^{-5} + 1 \cdot z^{-6}}{16}$$

The advantage with the cascaded architecture is at least twofold. First, the unit capacitors can be made larger, without resulting in excessive power consumption. Consequently, the overall circuitry and operation is less sensitive to normal tolerance deviations in the CMOS fabrication process. Second, the zeros in the transfer function are less sensitive to variations in the filter coefficients.

Figure 8:
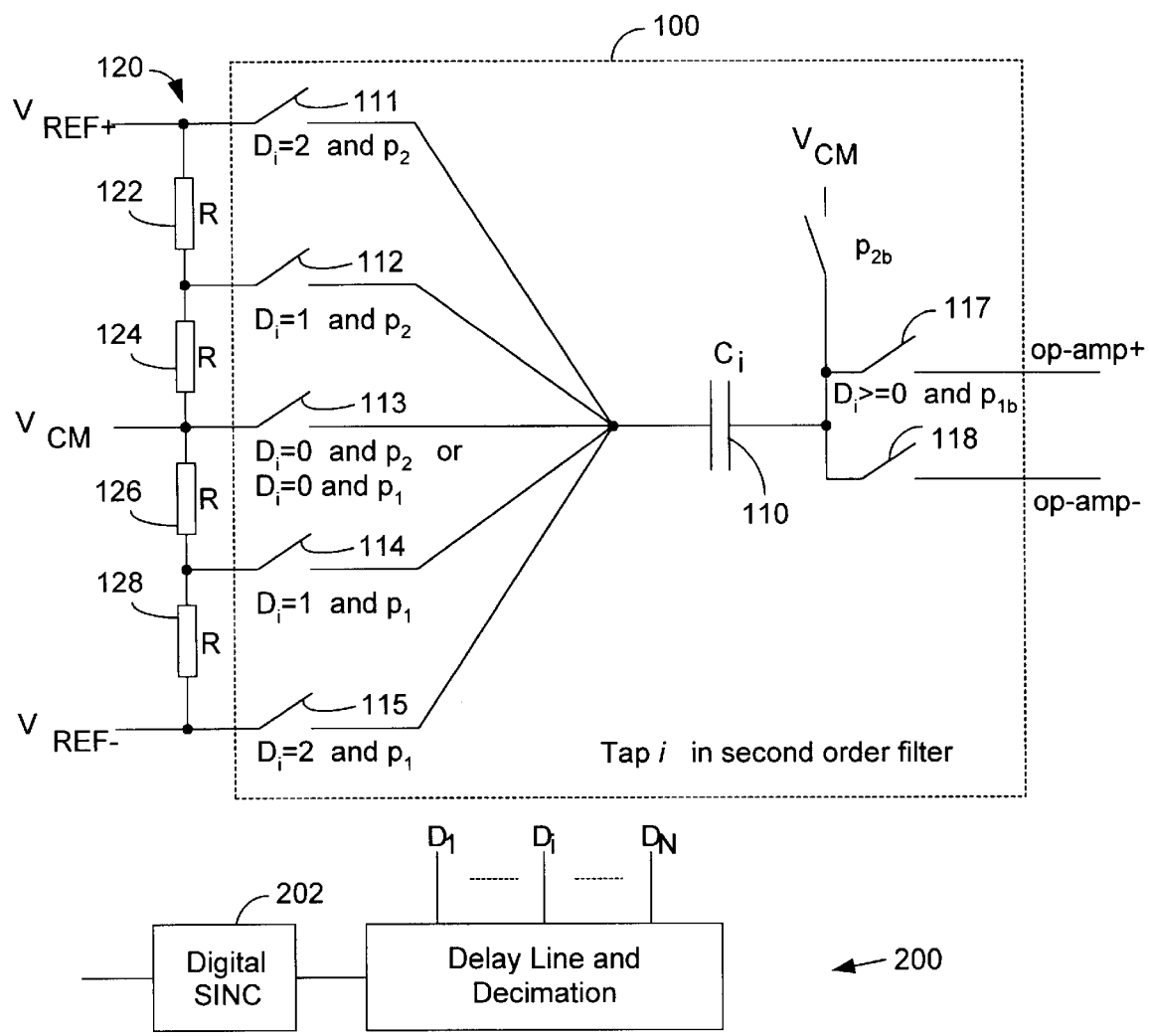
FIG. 8 is a diagram illustrating one section of a cascaded SINC filter constructed in accordance with an embodiment of the invention.

The filter, $H_1(z)$ (preferably a first order filter), may be implemented in a number of ways, consistent with the spirit of the present invention. In the preferred embodiment, the filter defined by $H_1(z)$ is implemented by a combination of a digital filter 202 and a capacitor 110 switched to a resistor string 120, as illustrated in FIG. 8. In essence, the SINC filter 140 is implemented much like the SINC filter 40, illustrated in FIG. 4A. However, the tap 100 and resistor string 120 of FIG. 8 is substituted in place of the taps illustrated in FIG. 4A.

As illustrated, each tap 100 preferably includes a series of switches 111, 112, 113, 114, and 115 that are interconnected with resistors 122, 124, 126, and 128. A digital filter 200 generates output signals Di that, in combination with the clocks p1 and p2 control the positions of the switches 111, 112, 113, 114, and 115. There are in total 7 Di signals, one for each tap in filter $H_2(z)$. As illustrated, the resistor string 120 generates different reference voltages at the various intermediate positions between resistors 122, 124, 126, and 128. The switches 111, 112, 113, 114, and 115 may be controlled to select the desired reference voltage.

Figure 9:
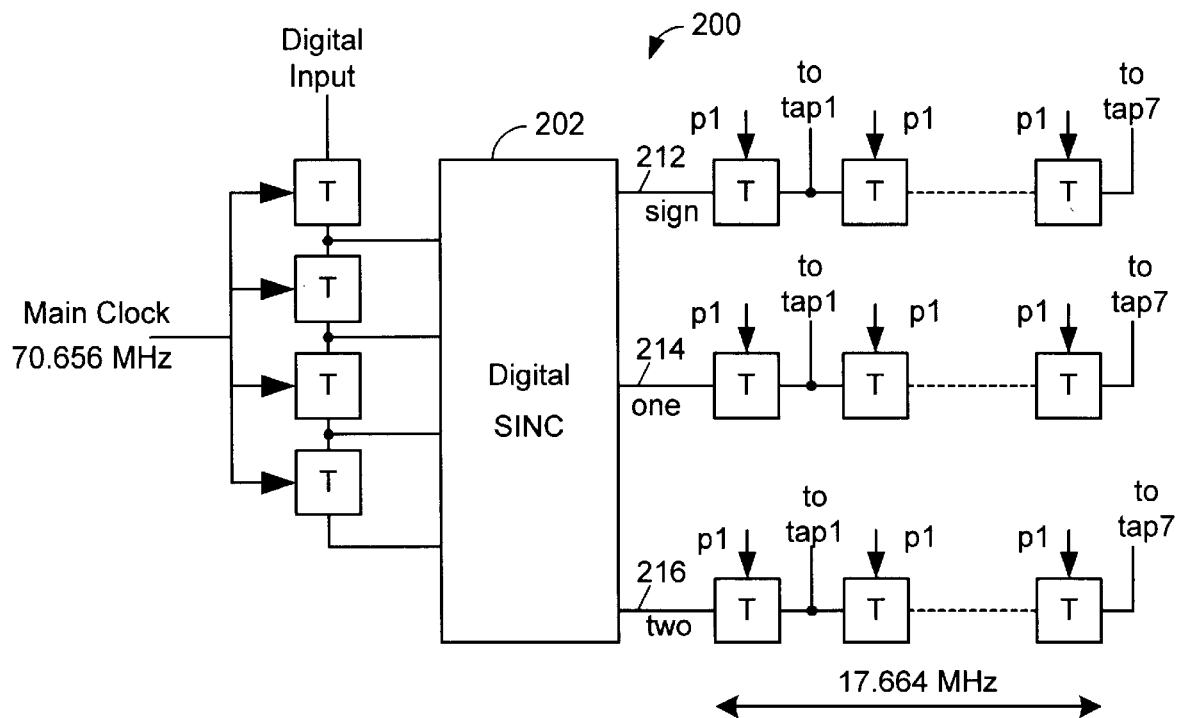
FIG. 9 is a diagram illustrating further details of the digital filter illustrated in FIG. 8.
Figure 9:
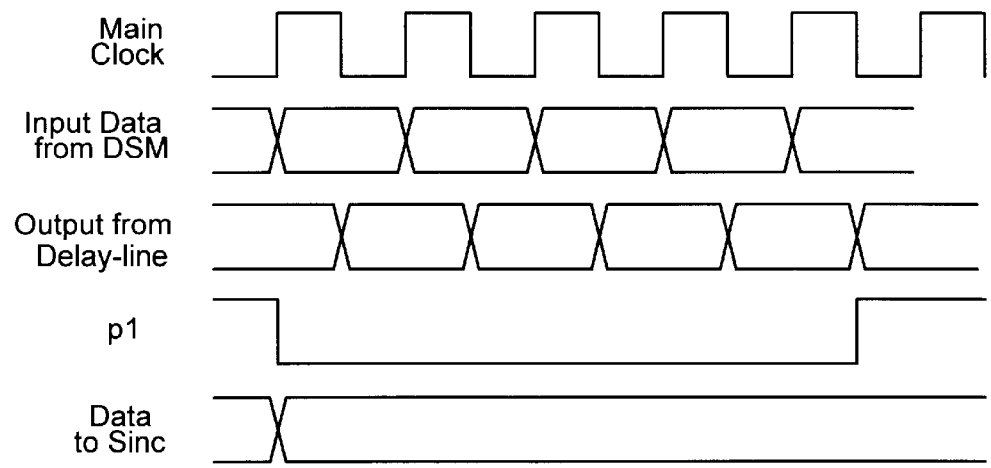

In the preferred embodiment, the signal Di is actually the three lines 212, 214, and 216 (see FIG. 9). For example, switch 111 is closed when Di=2 (e.g., line 216 is in the logic one state) and clock p2 is high. The switches 117 and 118 at the right-hand side of the capacitor may be controlled by the sign 212 signal (see FIG. 9). On clock phase p2, the right hand side of the capacitor 110 is connected to the common mode voltage Vcm, while the left hand side is connected to positive reference voltage Vref+ or the mid point of the resistive divider 122, 124 or Vcm depending on the value of Di. In this way the voltage over capacitor 110, and thereby also the charge on capacitor, is proportional to the value of Di. On clock phase p1 the left hand side of the capacitor is connected to reference voltage Vref− or the mid point of the resistive divider 126, 128 or Vcm depending on the value of Di. The voltage over the capacitor will now be reversed compared to what was stored on clock phase p2. The right hand side of the capacitor is now connected to the input of the opamp. The amount of charge from the capacitor transferred to the opamp is proportional to the value of Di. In a differential implementation the sign of the charge can easily be changed by connecting the right hand side of the capacitor to the other input of the opamp. This is achieved by closing switch 117 or 118 depending on the sign of Di.

The operation of the digital part of the SINC filter is shown in FIG. 9. As shown, a delay line with preferably 4 latches is operated at the full speed (e.g., 70.656 MHz). The outputs from the delay line may be used to generate a first order SINC filter in the digital domain. The output may have five possible output levels (+2, +1, 0, −1, −2), which are represented by three digital signals called sign 212, one 214, and two 216. The zero level may be represented by making both one and two low. The signals from the digital SINC filter may be fed to a delay line 230, where they are decimated. The outputs of this delay line are used by the taps in the analog part of the SINC filter (see FIG. 10). By way of reference, the lines 212, 214, and 216 are each denoted to have a connection "to tap 1". These three connections collectively comprise the signal denoted as D1 in FIG. 8.

The switch resistance must be low enough to ensure the settling error is within the required resolution of the D/A converter. Since the filter now runs at the decimated speed the switches are easier to design compared to previously reported implementations where the filter runs at the higher speed. The switch resistance may be scaled proportionally to the capacitor size. The common-mode voltage at the top plates may be 2.5 V, while it is set by the op-amp bias circuit in the first integrator of the biquad for the bottom plates (1.4 V–1.7 V). This enables the use of a telescopic op-amp.

The right hand plate of the capacitor may be switched to the first op-amp in the biquad as:before, which means that no additional op-amp is needed and the switched capacitors can still be switched at the lower speed (e.g., 17.664 MHz). The sign of the data is controlled by the switches at the input of the op-amp, as described in the previous embodiment. Four clock phases may be used in the circuit where $p_1$ and $p_2$ are non-overlapping clock phases while $P_{1b}$ and $P_{2b}$ are turned off slightly before $p_1$ and $p_2$ respectively to reduce the effect of clock feedthrough (see FIG. 4B).

Figure 10:
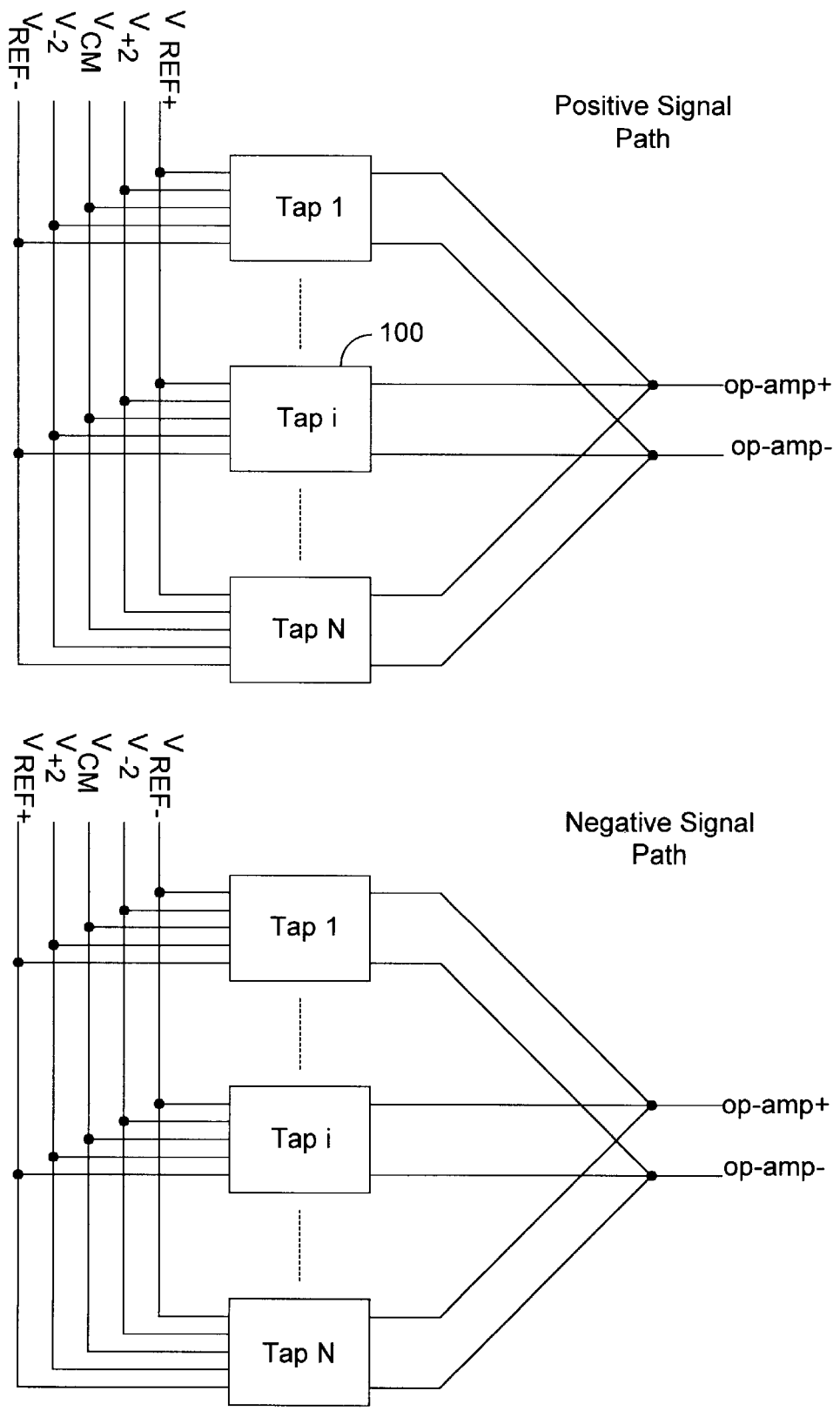
FIG. 10 is a diagram illustrating one section of a cascaded SINC filter constructed in accordance with an embodiment of the invention.

The second filter, $H_2(z)$ (preferably a second order filter), may be implemented as described in the previous embodiment by using several capacitors, now all switched to the same resistor string. This is illustrated in FIG. 10, showing both the negative and positive signal path of the differential circuit. Each tap 100 corresponds to one capacitor and set of switches as shown in FIG. 8. Preferably, the capacitor sizes are directly proportional to the coefficients presented in the equation for $H_2(z)$.

Mismatch

The sensitivity to capacitor mismatch was investigated by computer simulations. A DMT (Discrete Multi-Tone) signal was used in the simulation. Th e mismatch errors were added as relative errors directly to the capacitors Based upon measurements, the capacitor mismatch was estimated to be about 0.1–0.2%. With the previous non-cascaded design the average PSD is approximately 400–500 nV/rtHz, while with the proposed cascaded filters the PSD is below 30 nV/rtHz. The conclusion from the simulations is that by cascading two filters the sensitivity to mismatch is significantly reduced.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of the present invention and protected by the following claims.

Figure 11:
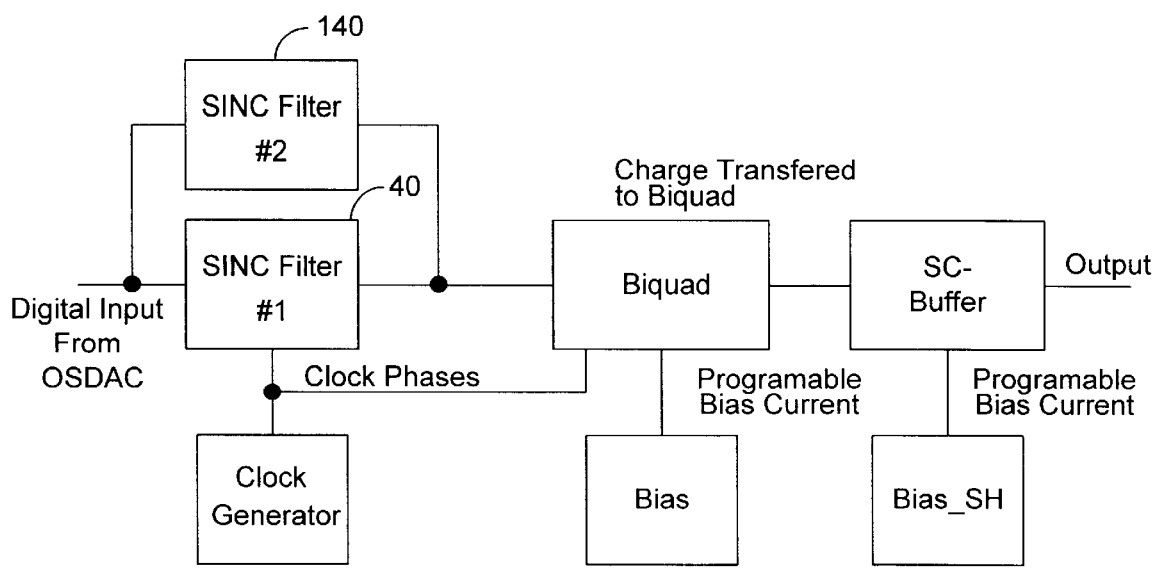
FIG. 11 is a block diagram illustrating an embodiment of a OSDAC utilizing multiple SINC filters.

For example, reference is made to FIG. 11, which shows one embodiment of an OSDAC which utilizes SINC filters 40 and 140. That is, one embodiment may utilize SINC filter 40. In addition, the embodiment may utilize SINC filter 140 connected in parallel with SINC filter 40. Such an embodiment may be provided for purposes of retrofitability. In this regard, it is contemplated that only one of the two SINC filters 40 and 140 will be switched in or operative at any given time.

Further, since one of ordinary skill in the art is capable of configuring the circuitry necessary to implement the functional features of various drawings, the block diagrams supplied are a sufficient representation of the preferred embodiment of the invention.

What is claimed is:

1. A filter for oversampling Sigma-Delta digital-to-analog converter circuits, comprising:

a SINC filter that decimates a digital data input signal by a predetermined factor of an over-sampling ratio utilized by a Sigma-Delta modulator, the SINC filter being defined by a cascaded architecture; and a switched-capacitor biquad filter having a programmable cut-off frequency which tracks the over-sampling ratio.

2. The filter of claim Error! Bookmark not defined., wherein the cascaded SINC filter is defined by first and second cascaded sections, wherein the SINC filter is defined by a transfer function H(z), which is further defined by first and second constituent transfer functions $H_1(z)$ and $H_2(Z)$.

3. The filter of claim 2, where $H_1(z)$ is the transfer function defining the first cascaded section and $H_2(Z)$ is the transfer function defining the second section, and further wherein:

$$H_1(z) = \frac{1}{4} \cdot \left(\frac{1-z^{-4}}{1-z^{-1}}\right)^1 = \frac{1+1 \cdot z^{-1}+1 \cdot z^{-2}+1 \cdot z^{-3}}{4} \text{ and}$$

$$H_2(z) = \frac{1}{16} \cdot \left(\frac{1-z^{-4}}{1-z^{-1}}\right)^2 = \frac{1+2 \cdot z^{-1}+3 \cdot z^{-2}+4 \cdot z^{-3}+3 \cdot z^{-4}+2 \cdot z^{-5}+1 \cdot z^{-6}}{16}.$$

4. The filter of claim 3, wherein the first cascaded section is implemented by a combination of a digital filter and capacitor switched to a resistor string.

5. The filter of claim 4, wherein the second cascaded section is implemented using a plurality of capacitors switched to the resistor string.

6. The filter of claim 2, wherein the first cascaded section is a first order filter.

7. The filter of claim 1, wherein capacitor switching is applied in response to the applicable digital subscriber line application mode.

8. The filter of claim 1, wherein one of the cascaded sections includes a plurality of series connected resistors defining a plurality of intermediate reference voltages.

9. The filter of claim 8, further including a plurality of switching element configured to switch one of the reference voltages to a capacitor.

10. A central office digital subscriber line transmission unit utilizing the filter of claim 1.

11. An integrated circuit comprising the filter of claim 1.

12. A SINC filter for an oversampling Sigma-Delta digital-to-analog converter circuit, comprising:

first and second cascaded sections, wherein the SINC filter is defined by a transfer function H(z), which is further defined by first and second constituent transfer functions $H_1(z)$ and $H_2(z)$ a switched-capacitor biquad filter having a cut-off frequency which tracks the over-sampling ratio.

13. The filter of claim 12, where $H_1(z)$ is the transfer function defining the first cascaded section and $H_2(z)$ is the transfer function defining the second section, and further wherein:

$$H_1(z) = \frac{1}{4} \cdot \left(\frac{1-z^{-4}}{1-z^{-1}}\right)^1 = \frac{1+1 \cdot z^{-1}+1 \cdot z^{-2}+1 \cdot z^{-3}}{4} \text{ and}$$

$$H_2(z) = \frac{1}{16} \cdot \left(\frac{1-z^{-4}}{1-z^{-1}}\right)^2 = \frac{1+2 \cdot z^{-1}+3 \cdot z^{-2}+4 \cdot z^{-3}+3 \cdot z^{-4}+2 \cdot z^{-5}+1 \cdot z^{-6}}{16}.$$

14. The filter of claim 13, wherein the second cascaded section is implemented using a plurality of capacitors switched to a resistor string.

15. The filter of claim 12, wherein one of the cascaded sections includes a plurality of series connected resistors defining a plurality of intermediate reference voltages.

16. The filter of claim 15, further including a plurality of switching element configured to switch one of the reference voltages to a capacitor.

17. The filter of claim 12, wherein the first cascaded section is implemented by a digital SINC and a delay line with decimation.

18. The filter of claim 13, wherein the first cascaded section is a first order filter.

19. A filter for oversampling Sigma-Delta digital-to-analog converter circuits, comprising:

a SINC filter that decimates a digital data input signal by a predetermined factor of an over-sampling ratio utilized by a Sigma-Delta modulator, the SINC filter being defined by a cascaded architecture that is defined by first and second cascaded sections having first and second constituent transfer functions $H_1(z)$ and $H_2(z)$, wherein:

$$H_1(z) = \frac{1}{4} \cdot \left(\frac{1-z^{-4}}{1-z^{-1}}\right)^1 = \frac{1+1 \cdot z^{-1}+1 \cdot z^{-2}+1 \cdot z^{-3}}{4} \text{ and}$$

$$H_2(z) = \frac{1}{16} \cdot \left(\frac{1-z^{-4}}{1-z^{-1}}\right)^2 = \frac{1+2 \cdot z^{-1}+3 \cdot z^{-2}+4 \cdot z^{-3}+3 \cdot z^{-4}+2 \cdot z^{-5}+1 \cdot z^{-6}}{16}; \text{ and}$$

a switched-capacitor biquad filter having a programmable cut-off frequency, which tracks the over-sampling ratio.

* * * * *

UNITED STATES PATENT AND TRADEMARK OFFICE
CERTIFICATE OF CORRECTION

PATENT NO.    : 6,614,374 B1
DATED         : September 2, 2003
INVENTOR(S)   : Gustavsson et al.

It is certified that error appears in the above-identified patent and that said Letters Patent is hereby corrected as shown below:

<u>Column 10,</u>
Line 59, please delete "Error! Bookmark not defined" after the word "claim", and replace with -- 1 --

Signed and Sealed this

Twenty-third Day of December, 2003

JAMES E. ROGAN
*Director of the United States Patent and Trademark Office*